(12) United States Patent
Kato

(10) Patent No.: US 11,386,638 B2
(45) Date of Patent: Jul. 12, 2022

(54) RECOGNITION PARAMETER OPTIMIZATION DEVICE, COMPONENT MOUNTING SYSTEM AND RECOGNITION PARAMETER OPTIMIZATION METHOD

(71) Applicant: YAMAHA HATSUDOKI KABUSHIKI KAISHA, Iwata (JP)

(72) Inventor: Hiroshi Kato, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 57 days.

(21) Appl. No.: 17/049,918

(22) PCT Filed: May 31, 2018

(86) PCT No.: PCT/JP2018/020913
§ 371 (c)(1),
(2) Date: Oct. 22, 2020

(87) PCT Pub. No.: WO2019/229920
PCT Pub. Date: Dec. 5, 2019

(65) Prior Publication Data
US 2021/0241017 A1 Aug. 5, 2021

(51) Int. Cl.
*G06V 10/20* (2022.01)
*G06T 5/00* (2006.01)
*G06T 7/00* (2017.01)

(52) U.S. Cl.
CPC ............ *G06V 10/255* (2022.01); *G06T 5/009* (2013.01); *G06T 7/0004* (2013.01); *G06T 2207/10024* (2013.01); *G06V 2201/07* (2022.01)

(58) Field of Classification Search
CPC .......... G06K 9/00013; G06K 2209/21; G06K 9/00335; G06K 9/3241; G06T 5/009;
(Continued)

(56) References Cited

U.S. PATENT DOCUMENTS

2004/0109172 A1* 6/2004 Nagao ................ H05K 13/0812
356/615
2012/0140986 A1* 6/2012 Maiden ..................... G01J 1/42
382/103
(Continued)

FOREIGN PATENT DOCUMENTS

JP     2002050895 A        2/2002
JP     2002366613 A   *  12/2002
(Continued)

OTHER PUBLICATIONS

An Office Action; "Notice of Reasons for Refusal," mailed by the Japanese Patent Office dated Nov. 2, 2021, which corresponds to Japanese Patent Application No. 2020-522494 and is related to U.S. Appl. No. 17/049,918 with English translation.
(Continued)

*Primary Examiner* — Nizar N Sivji
(74) *Attorney, Agent, or Firm* — Studebaker & Brackett PC

(57) ABSTRACT

The image data obtained by imaging the component in the component recognition when the component mounter mounts the component on the board is stored in the storage, and the luminance related condition is optimized based on this image data. Therefore, a proper luminance related condition corresponding to the component to be actually mounted can be obtained.

15 Claims, 18 Drawing Sheets

(58) Field of Classification Search
CPC ......... G06T 7/0004; G06T 2207/10152; G06T 2207/10024; H05K 13/0812; H05K 13/0818

See application file for complete search history.

(56) References Cited

U.S. PATENT DOCUMENTS

| | | | | |
|---|---|---|---|---|
| 2012/0257043 | A1* | 10/2012 | Tsuboi | H05K 13/0812 348/86 |
| 2012/0293648 | A1* | 11/2012 | Nakayama | H05K 13/0452 348/87 |
| 2015/0125035 | A1* | 5/2015 | Miyatani | B25J 9/1697 382/103 |
| 2016/0035940 | A1* | 2/2016 | Fujita | G06K 9/0004 438/29 |
| 2018/0114299 | A1* | 4/2018 | Hattori | H04N 9/64 |

FOREIGN PATENT DOCUMENTS

| | | | |
|---|---|---|---|
| JP | 2002366613 | A | 12/2002 |
| JP | 2003-042970 | A | 2/2003 |
| JP | 2011211088 | A | 10/2011 |
| JP | 2018063973 | A * | 4/2018 |
| JP | 2018063973 | A | 4/2018 |

OTHER PUBLICATIONS

International Search Report issued in PCT/JP2018/020913; dated Aug. 28, 2018.

* cited by examiner

F I G. 4
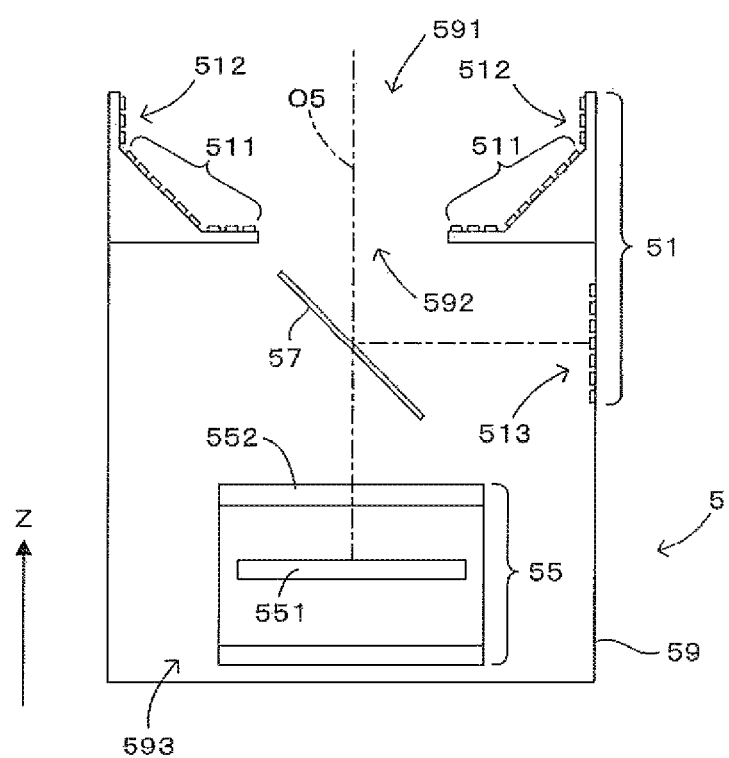

COMPONENT DATA LIBRARY

| LIBRARY NUMBER | COMPONENT ATTRIBUTE | | RECOGNITION PARAMETER | | | | | |
|---|---|---|---|---|---|---|---|---|
| | | | COMPONENT RELATED CONDITION | | | | LUMINANCE RELATED CONDITION | |
| | TYPE | MANUFACTURER | SHAPE | SIZE | ELECTRODE POSITION | ELECTRODE SIZE | ILLUMINATION LEVEL | THRESHOLD VALUE |
| 1 | R1005 | Ca Inc. | ... | ... | ... | ... | ... | ... |
| 2 | C1005 | Ca Inc. | ... | ... | ... | ... | ... | ... |
| 3 | R0201 | Ca Inc. | ... | ... | ... | ... | ... | ... |
| 4 | C0201 | Ca Inc. | ... | ... | ... | ... | ... | ... |
| 5 | ... | ... | | | | | | |
| 6 | ... | ... | | | | | | |
| 7 | | | | | | | | |

IMAGE DATABASE

| IMAGE DATA | LIBRARY NUMBER |
|---|---|
| Dp(1) | 2 |
| Dp(2) | 10 |
| Dp(3) | 2 |
| Dp(4) | 5 |
| Dp(5) | 9 |
| Dp(6) | 2 |
| Dp(7) | 5 |
| Dp(8) | 5 |
| Dp(9) | 2 |
| Dp(10) | 7 |
| Dp(11) | 1 |
| Dp(12) | 3 |
| Dp(13) | ... |

FIG. 10

| ILLUMI-NATION LEVEL 8/L | LUMINANCE THRESHOLD VALUE | | | | | | | | | | | | | | | | | | | | | | | | |
|---|---|---|---|---|---|---|---|---|---|---|---|---|---|---|---|---|---|---|---|---|---|---|---|---|---|
| | 10 | 20 | 30 | 40 | 50 | 60 | 70 | 80 | 90 | 100 | 110 | 120 | 130 | 140 | 150 | 160 | 170 | 180 | 190 | 200 | 210 | 220 | 230 | 240 | 250 |
| 8/8 | NG | NG | NG | NG | NG | NG | NG | NG | NG | NG | NG | NG | NG | NG | NG | NG | NG | NG | NG | NG | OK | NG | NG | NG | NG |
| 7/8 | NG | NG | NG | NG | NG | NG | NG | NG | NG | NG | NG | NG | NG | NG | NG | OK | OK | OK | OK | OK | OK | NG | NG | NG | NG |
| 6/8 | NG | NG | NG | NG | NG | NG | NG | NG | NG | NG | NG | OK | OK | OK | OK | OK | OK | OK | OK | OK | OK | OK | NG | NG | NG |
| 5/8 | NG | NG | NG | NG | OK | OK | OK | OK | OK | OK | OK | OK | OK | OK | OK | OK | OK | OK | OK | OK | NG | NG | NG | NG | NG |
| 4/8 | NG | NG | NG | OK | OK | OK | OK | OK | OK | OK | OK | OK | OK | NG | NG | NG | NG | NG | NG | NG | NG | NG | NG | NG | NG |
| 3/8 | NG | NG | NG | NG | OK | OK | OK | OK | OK | OK | NG | NG | NG | NG | NG | NG | NG | NG | NG | NG | NG | NG | NG | NG | NG |
| 2/8 | NG | NG | NG | NG | NG | NG | NG | NG | NG | NG | NG | NG | NG | NG | NG | NG | NG | NG | NG | NG | NG | NG | NG | NG | NG |
| 1/8 | NG | NG | NG | NG | NG | NG | NG | NG | NG | NG | NG | NG | NG | NG | NG | NG | NG | NG | NG | NG | NG | NG | NG | NG | NG |

F I G. 1 7

IMAGE DATABASE

| IMAGE DATA | REFERENCE IMAGE DATA | LIBRARY NUMBER |
|---|---|---|
| Dp(1) | Dpr(1) | 2 |
| Dp(2) | Dpr(2) | 10 |
| Dp(3) | Dpr(3) | 2 |
| Dp(4) | Dpr(4) | 5 |
| Dp(5) | Dpr(5) | 9 |
| Dp(6) | Dpr(6) | 2 |
| Dp(7) | Dpr(7) | 5 |
| Dp(8) | Dpr(8) | 5 |
| Dp(9) | Dpr(9) | 2 |
| Dp(10) | Dpr(10) | 7 |
| Dp(11) | Dpr(11) | 1 |
| Dp(12) | Dpr(12) | 3 |
| Dp(13) | Dpr(13) | ... |

RECOGNITION PARAMETER OPTIMIZATION DEVICE, COMPONENT MOUNTING SYSTEM AND RECOGNITION PARAMETER OPTIMIZATION METHOD

This application is a National Stage of International Patent Application No. PCT/JP2018/020913, filed May 31, 2018, the entire contents of which is incorporated herein by reference.

BACKGROUND

Technical Field

This disclosure relates to a technique for recognizing a component by imaging the component by a camera.

Background Art

Conventionally, a component mounter for mounting a component sucked by a mounting head on a board is known. In such a component mounter, the component is mounted in accordance with mounting data representing component information such as the size of the component. Particularly, JP2002-050895 describes a technique for associating and storing an original image of a component and component information in advance in the database, and generating mounting data by extracting component information from a database by comparing an image obtained by a component mounter imaging a component to the original image of the database. The component mounter can suck the component by a mounting head and mount the component on a board based on the mounting data generated in this way.

However, in such a component mounter, the mounting of the component may fail since the mounting head is not properly sucking the component. Accordingly, component recognition for recognizing the component based on the image obtained by imaging the component by a camera is performed as appropriate. In this component recognition, whether or not the component is properly sucked by the mounting head is judged, for example, based on a comparison of a size of the component included in the image and an allowable value. Particularly, JP2011-211088 shows a technique for adjusting an allowable value of a component size based on an image captured in component recognition.

SUMMARY

The component recognition is performed based on a result of an image processing using a threshold value for a luminance of an image captured while light is irradiated to the component from an illuminator. A condition on such a luminance of an image (luminance related condition), i.e. a combination of a brightness of the light of the illuminator and the threshold value used in the component recognition, is set in advance before the start of the component recognition and the component mounter performs the component recognition using this luminance related condition.

However, there have been cases where the accuracy of the component recognition in component mounting is reduced since the luminance related condition set before the start of the component recognition does not correspond to a component to be actually mounted. Such a reduction in the accuracy of the component recognition becomes a factor for erroneously judging that the posture of the component or the component itself is not suitable for mounting although the component is an aimed component and the component having a proper shape is properly sucked.

This disclosure was developed in view of the above, and aims to provide a technique capable of obtaining a proper luminance related condition corresponding to a component to be actually mounted.

A recognition parameter optimization device according to the disclosure, comprises a communication unit that receives image data obtained in a component mounter that performs component recognition to recognize a component based on a result of performing an image processing for a luminance indicated by the image data, which is obtained by imaging the component by a camera while irradiating light to the component from an illuminator, using a threshold value and mounts the component on a board based on a result of the component recognition; a storage that stores the image data received by the communication unit; and an arithmetic unit that optimizes a luminance related condition indicating a combination of a brightness of the light of the illuminator and the threshold value used in the component recognition based on the image data stored in the storage and stores an optimized luminance related condition in the storage.

A recognition parameter optimization method according to the disclosure, comprises receiving image data by a communication unit, the image data being obtained by a component mounter that performs component recognition to recognize a component based on a result of performing an image processing for a luminance indicated by the image data, which is obtained by imaging the component by a camera while irradiating light to the component from an illuminator, using a threshold value and mounts the component on a board based on a result of the component recognition; a storing the image data received by the communication unit in a storage; and optimizing a luminance related condition indicating a combination of a brightness of the light of the illuminator and the threshold value used in the component recognition based on the image data stored in the storage and storing an optimized luminance related condition in the storage.

In the thus configured disclosure (recognition parameter optimization device, recognition parameter optimization method), the image data obtained by imaging the component in the component recognition when the component mounter mounts the component on the board is stored in the storage, and the luminance related condition is optimized based on this image data. Therefore, a proper luminance related condition corresponding to a component to be actually mounted can be obtained.

The recognition parameter optimization device may be configured so that the storage stores the image data in association with an attribute of the image data, the attribute is distinguished at least by a type of the component included in the image data, and the arithmetic unit optimizes the luminance related condition in performing the component recognition for the type of the component corresponding to the same attribute based on a plurality of pieces of image data having the same attribute. In such a configuration, a proper luminance related condition corresponding to the type of the component to be actually mounted can be obtained.

The recognition parameter optimization device may be configured so that the attribute is distinguished by a combination of the type of the component and at least one of a manufacturer of the component as a target of the component recognition, the camera used in the component recognition, and the component mounter having performed the component recognition. In such a configuration, a proper luminance related condition corresponding to the manufacturer of the component as a target of the component recognition, the camera used in the component recognition or the component mounter having performed the component recognition and the like can be obtained.

The recognition parameter optimization device may be configured so that the arithmetic unit transmits the luminance related condition optimized based on the image data having the attribute received by the communication unit to the component mounter via the communication unit, if the communication unit receives the attribute of the image data planned to be obtained in the component recognition. In such a configuration, by transmitting the attribute of the image data planned to be obtained in the component recognition to the recognition parameter optimization device, the luminance related condition optimized according to this attribute can be transmitted to the component mounter. Therefore, the component recognition planned to be performed can be performed on the luminance related condition corresponding to the attribute of the image data of the component planned to be obtained in the component recognition.

The recognition parameter optimization device so that the arithmetic unit transmits the luminance related condition optimized based on the image data having a predetermined relationship with the image data received by the communication unit to the component mounter via the communication unit, if the communication unit receives the image data obtained by the component mounter imaging the component before start of the component recognition. In such a configuration, by obtaining image data by imaging the component before the start of the component recognition and transmitting the obtained image data to the recognition parameter optimization device, the component mounter can receive the luminance related condition optimized based on the image data having the predetermined relationship with the transmitted image data. Therefore, the component mounter can start the component recognition in component mounting on the luminance related condition corresponding to the component to be actually mounted.

The recognition parameter optimization device may be configured so that the arithmetic unit transmits the luminance related condition optimized based on the image data similar to the image data received by the communication unit to the component mounter via the communication unit. In such a configuration, the component mounter can properly start the component recognition based on the luminance related condition optimized based on the image data similar to the image data of the component obtained before the start of the component recognition.

The recognition parameter optimization device may be configured so that the communication unit receives the image data obtained before the start of the component recognition by the component mounter imaging the component on a predetermined illumination condition of irradiating light of a predetermined brightness from the illuminator.

The recognition parameter optimization device may be configured so that the storage stores the image data, equivalent to a case where the image data obtained on the luminance related condition is obtained on the predetermined illumination condition, as reference image data in association with the luminance related condition, and the arithmetic unit transmits the luminance related condition associated with the reference image data similar to the image data received by the communication unit to the component mounter via the communication unit. In such a configuration, the recognition parameter optimization device can precisely transmit a proper luminance related condition to the component mounter based on the image data obtained by the component mounter imaging the component on the predetermined illumination condition.

The recognition parameter optimization device may be configured so that the storage stores the image data used in optimizing the luminance related condition and the luminance related condition in association, the arithmetic unit transmits the luminance related condition associated with the image data satisfying a predetermined collation condition as a result of collating the image data received by the communication unit and the image data associated with the luminance related condition to the component mounter via the communication unit, and the collation condition is a condition on which adjusted image data generated by adjusting a luminance of the image data received by the communication unit according to a difference between the predetermined illumination condition and the luminance related condition associated with the image data to be collated and the image data to be collated are similar. In such a configuration, the recognition parameter optimization device can precisely transmit a proper luminance related condition to the component mounter based on the image data obtained by the component mounter imaging the component on the predetermined illumination condition.

The recognition parameter optimization device may be configured so that the component is recognized in the component recognition based on a comparison of the component extracted from the image data using the threshold value of the luminance related condition and a component related condition on a configuration of the component, and the arithmetic unit optimizes the component related condition based on the configuration of the component extracted from the image data using the threshold value of the optimized luminance related condition and stores an optimized component related condition in the storage. In such a configuration, the component related condition corresponding to the optimized luminance related condition can be obtained.

A component mounting system according to the disclosure, comprises: a component mounter that performs component recognition to recognize a component based on a result of performing an image processing for a luminance indicated by the image data, which is obtained by imaging the component by a camera while irradiating light to the component from an illuminator, using a threshold value and mounts the component on a board based on a result of the component recognition; and the recognition parameter optimization device described above. Therefore, it is possible to suppress a reduction in the accuracy of the component recognition due to an improper luminance related condition on a luminance of an image obtained by imaging a component.

According to the disclosure, it is possible to obtain a proper luminance related condition corresponding to a component to be actually mounted.

BRIEF DESCRIPTION OF THE DRAWINGS

FIG. 4 is a diagram schematically showing an example of the configuration of the component recognition camera provided in the component mounter of FIG. 1;

FIG. 5 is a table showing an example of the component data library;

FIG. 6 is a table showing an example of an image database;

FIG. 10 is a table showing a calculation result in the optimization process of the luminance related condition of FIG. 9;

FIG. 17 is a table showing an example of the image database, upon which the production start preparation of FIG. 16 is premised.

DETAILED DESCRIPTION

Figure 1:
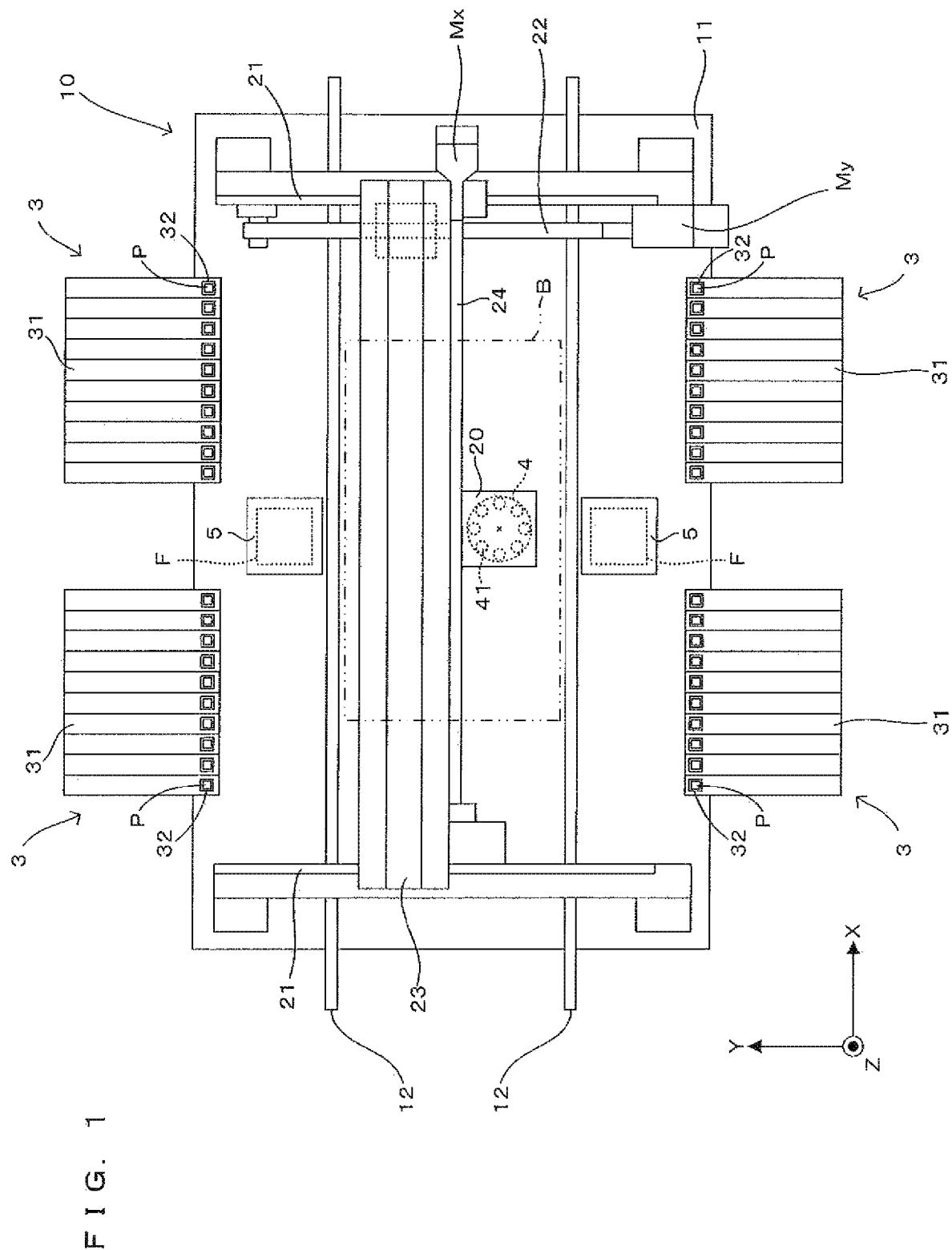
FIG. 1 is a partial plan view schematically showing a component mounter provided in a component mounting system according to the disclosure.
Figure 2:
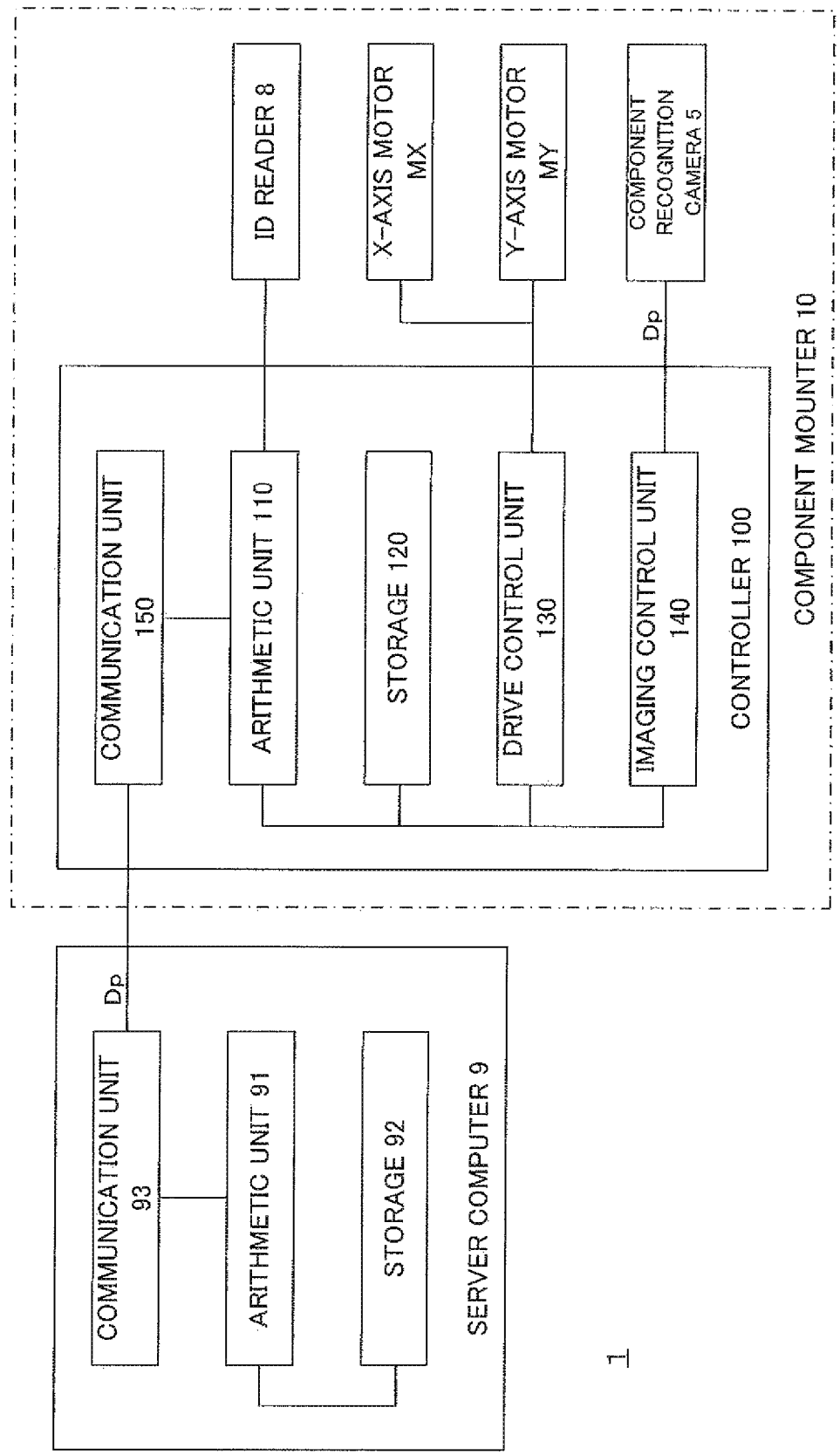
FIG. 2 is a block diagram showing an electrical configuration of the component mounting system according to the disclosure.

FIG. 1 is a partial plan view schematically showing a component mounter provided in a component mounting system according to the disclosure. In FIG. 1, an XYZ Cartesian coordinate system, in which a Z direction is a vertical direction, is shown as appropriate. Further, FIG. 2 is a block diagram showing an electrical configuration of the component mounting system according to the disclosure. As shown in FIG. 2, the component mounting system 1 includes a component mounter 10 and a server computer 9 that manages the component mounter 10.

The component mounter 10 includes a controller 100 that integrally controls the entire machine. The controller 100 is a computer including an arithmetic unit 110, which is a processor constituted by a CPU (Central Processing Unit) and a RAM (Random Access Memory), and a storage 120 constituted by an HDD (Hard Disk Drive). Further, the controller 100 includes a drive control unit 130 that controls a drive system of the component mounter 10, an imaging control unit 140 that controls an imaging system of the component mounter 10 and a communication unit 150 that carries out communication with the server computer 9.

The arithmetic unit 110 mounts components P in a procedure specified by a mounting program by controlling the drive control unit 130 and the imaging control unit 140 in accordance with the mounting program stored in the storage 120. At this time, the arithmetic unit 110 controls the mounting of the components P based on image data Dp obtained by the imaging control unit 140 imaging the components P using component recognition cameras 5. The image data Dp of the components P imaged by the component recognition cameras 5 is transmitted to the server computer 9 by the communication unit 150 as described in detail later.

As shown in FIG. 1, this component mounter 10 includes a pair of conveyors 12, 12 provided on a base 11. The component mounter 10 mounts the components P on a board B carried into a mounting process position (position of the board B of FIG. 1) from an upstream side in an X direction (board conveying direction) by the conveyors 12 and carries out the board B (components-mounted board B) finished with the mounting of the components P to a downstream side in the X direction from the mounting process position by the conveyors 12.

A pair of Y-axis rails 21, 21 parallel to a Y direction orthogonal to the X direction, a Y-axis ball screw 22 parallel to the Y direction and a Y-axis motor My (servo motor) that rotationally drives the Y-axis ball screw 22 are provided in the component mounter 10, and an X-axis rail 23 parallel to the X direction is fixed to a nut of the Y-axis ball screw 22 while being supported on the pair of Y-axis rails 21, 21 movably in the Y direction. An X-axis ball screw 24 parallel to the X direction and an X-axis motor Mx (servo motor) that rotationally drives the X-axis ball screw 24 are attached to the X-axis rail 23, and a head unit 20 is fixed to a nut of the X-axis ball screw 24 while being supported on the X-axis rail 23 movably in the X direction.

Accordingly, the drive control unit 130 of FIG. 2 can control a movement of the head unit 20 by controlling the Y-axis motor My and the X-axis motor Mx. That is, the drive control unit 130 moves the head unit 20 in the Y direction by causing the Y-axis motor My to rotate the Y-axis ball screw 22, and moves the head unit 20 in the X direction by causing the X-axis motor Mx to rotate the X-axis ball screw 24.

As shown in FIG. 1, two component supply units 3 are arranged in the X direction on each of both sides of the pair of conveyors 12, 12 in the Y direction. A plurality of tape feeders 31 are detachably mounted side by side in the X direction in each component supply unit 3. The tape feeder 31 extends in the Y direction and has a component supply position 32 on a tip part on the side of the head unit 20 in the Y direction. A component supply reel 7 (FIG. 3) wound with a tape storing the components P in the form of small pieces such as integrated circuits, transistors and capacitors at predetermined intervals is arranged for each tape feeder 31, and the tape pulled out from the component supply reel 7 is loaded into the tape feeder 31. The tape feeder 31 intermittently feeds the tape in the Y direction toward the head unit 20. In this way, the components P in the tape are fed in the Y direction (feeding direction) and successively supplied to the component supply position 32 of the tape feeder 31.

Figure 3:
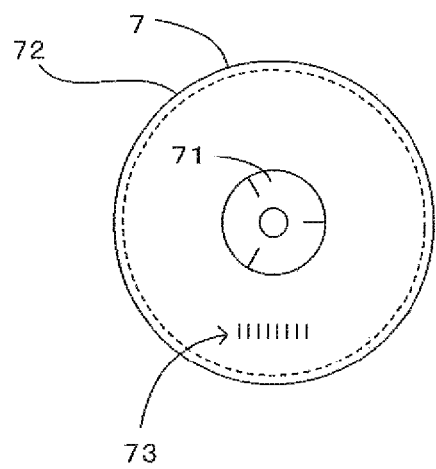
FIG. 3 is a diagram schematically showing an example of the component supply reel.

FIG. 3 is a diagram schematically showing an example of the component supply reel. The component supply reel 7 includes a shaft center 71 and two side plates 72 sandwiching the shaft center 71 from both sides, and supports the tape wound on the shaft center 71 from the both sides by the side plates 72. Further, the reel 7 includes a component ID 73 constituted by a barcode on the side plate 72. The component ID 73 indicates component attributes such as the type and the manufacturer of the components P stored in the tape of the component supply reel 7 having the component ID 73 attached thereto. In contrast, the component mounting system 1 includes an ID reader 8 that reads the component ID 73, and the arithmetic unit 110 can recognize the type and the like of the components P loaded into each tape feeder 31 based on the component attributes indicated by the component ID 73 read by the ID reader 8.

As shown in FIG. 1, the head unit 20 includes a so-called rotary mounting head 4. That is, the mounting head 4 includes a plurality of (eight) nozzles 41 arrayed at equal angular intervals on a circumference centered on an axis of rotation, and the plurality of nozzles 41 are rotatable about the axis of rotation. The mounting head 4 sucks/mounts the components P by the respective nozzles 41. Specifically, the mounting head 4 moves to a position above the tape feeder 31 and sucks (picks up) the component P supplied to the component supply position 32 by the tape feeder 31 by the nozzle 41. While holding the component P in this way, the mounting head 4 moves to a position above the board B at a mounting process position and mounts the component P on the board B. In this way, a component mounting process of sucking the component P and mounting the component P on the board B is performed by the component mounting system 1.

Further, in the component mounter 10, the component recognition cameras 5 attached to the base 11 while facing upward are arranged between the component supply units 3 and the conveyors 12 in the Y direction. The component recognition camera 5 images the component P sucked by the nozzle 41 of the mounting head 4 located at an upper position from below while the component P being within an imaging range F (field of view) of the component recognition camera 5. Then, the imaging control unit 140 recognizes the component P sucked by the nozzle 41 and determines whether or not a sucked state of the component P is good based on the image data Dp of the component P obtained by the component recognition camera 5 imaging the component P.

FIG. 4 is a diagram schematically showing an example of the configuration of the component recognition camera provided in the component mounter of FIG. 1. The component recognition camera 5 includes a light irradiation unit 51 that irradiates light to the component P in the imaging range F, an imaging unit 55 that images the component P irradiated with the light by the light irradiation unit 51 from below and a housing 59 that supports the light irradiation unit 51 and the imaging unit 55. A recess 591 is formed in an upper part of the housing 59, and a slit 592 open in the Z direction is provided in a bottom part of the recess 591. Further, an internal space 593 is provided below the slit 592 in the housing 59.

The light irradiation unit 51 includes a main illuminator 511, a side illuminator 512 and a coaxial illuminator 513. Each of the main illuminator 511, the side illuminator 512 and the coaxial illuminator 513 is configured by two-dimensionally arraying a plurality of LEDs (Light Emitting Diodes). The main illuminator 511 is arranged on a lower side of an inner wall of the recess 591 and irradiates light to the component P obliquely from below, and the side illuminator 512 is arranged above the main illuminator 511 on the inner wall of the recess 591 and laterally irradiates light to the component P. Further, the coaxial illuminator 513 is arranged on an inner wall of the internal space 593 and irradiates light to the component P from below via a beam splitter 57. That is, the beam splitter 57 is arranged in the internal space 593 of the housing 59, and the light emitted from the coaxial illuminator 513 is irradiated to the component P through the slit 592 after being reflected by the beam splitter 57. Such a light irradiation unit 51 can change a brightness (illumination level) of the light irradiated to the component P in eight levels (1/8 to 8/8) based on a control of the imaging control unit 140.

Further, the imaging unit 55 is arranged in the internal space 593 of the housing 59 and facing the slit 592 from below. The beam splitter 57 is arranged between the slit 592 and the imaging unit 55, and the imaging unit 55 images the light reflected by the component P irradiated by the light irradiation unit 51 and passed through the slit 592 and the beam splitter 57. This imaging unit 55 includes an area sensor 551 constituted by a solid state imaging element such as a COMS (Complementary MOS) image sensor or CCD (Charge-Coupled Device) image sensor, and a lens 552 arranged such that an optical axis O5 thereof is parallel to the Z direction. The lens 552 focuses the light reflected by the component P in the imaging range F on the area sensor 551, whereby an image of the component P is captured by the area sensor 551.

The imaging control unit 140 of FIG. 2 performs component recognition using such a component recognition camera 5. That is, if the component P sucked by the nozzle 41 reaches the imaging range F of the component recognition camera 5, the imaging control unit 140 images the component P by the imaging unit 55 while irradiating light of an illumination level corresponding to the component P from the light irradiation unit 51 to the component P. The imaging control unit 140 obtains image data Dp obtained by imaging the component P in this way from the area sensor 551. Further, the imaging control unit 140 performs edge detection for the image data Dp by binarizing a luminance of each pixel of the image data Dp using a luminance threshold value corresponding to the illumination level of the light irradiated from the light irradiation unit 51. In this way, (the image of) the component P included in the image data Dp is extracted. Further, the imaging control unit 140 compares the thus extracted component P to a condition (component related condition) on the configuration of the component P, which should be satisfied by the component P, and judges for each item of the component related condition whether or not a value of the extracted component P is within an allowable range. Here, the component related condition includes items indicating the configuration of the component P such as the shape of the component P, the size of the component P, electrode positions of the component P and electrode sizes of the component P. If each value of the component related condition of the extracted component P is within the allowable range, the imaging control unit 140 determines that the sucked state of the component P by the nozzle 41 is good. On the other hand, if any of these values is outside the allowable range, it is determined that the sucked state of the component P by the nozzle 41 is not good.

The arithmetic unit 110 causes the imaging control unit 140 to move the component P to a position above the board B and mount the component P on the board B if the sucked state is determined to be good as a result of the component recognition by the imaging control unit 140. On the other hand, the arithmetic unit 110 causes the component P to be discarded to an unillustrated disposal site if the sucked state is determined to be not good as the result of the component recognition by the imaging control unit 140.

To perform such component recognition, recognition parameters such as the component related condition, a luminance related condition (illumination level, luminance threshold value) and a recognition algorithm are necessary. Such recognition parameters are set in advance in the imaging control unit 140 before the start of the component recognition, and the imaging control unit 140 performs the component recognition based on these parameters. Further, in this embodiment, the recognition parameters are adjusted based on the image data Dp of the component P obtained in the component mounting process. Such a recognition parameter adjustment function is realized by the server computer 9.

As shown in FIG. 2, the server computer 9 includes an arithmetic unit 91, which is a processor constituted by a CPU and a RAM, a storage 92 constituted by an HDD, and a communication unit 93 that carries out communication with the communication unit 150 of the component mounter 10. A component data library (FIG. 5) associating the component attributes and the recognition parameters is stored in the storage 92.

FIG. 5 is a table showing an example of the component data library. In column "Type" of FIG. 5, "R" indicates that a function of the component P is resistance, "C" indicates that a function of the component P is capacitance, and a number following each of these letters indicates the shape and the size of the component P. That is, the type of the component P is distinguished (in other words, specified) by a combination of the function, shape and size of the component P. Further, "Manufacturer" of FIG. 5 indicates a manufacturer of the component P. The component attribute is distinguished (in other words, specified) by a combination of the type of the component P and the manufacturer of the component P, and different library numbers (component identification numbers) are attached to the components P having different component attributes. Furthermore, in the component data library, the recognition parameters according to the component attributes corresponding to the respective library numbers are associated. Thus, if the library number corresponding to the component P is designated, the recognition parameters used in the component recognition of the component P can be obtained.

Further, the arithmetic unit 110 constructs an image database (FIG. 6) by accumulating the image data Dp successively received from the component mounter 10 by the communication unit 93 in the storage 92. FIG. 6 is a table showing an example of an image database. Specifically, the arithmetic unit 110 stores the image data Dp in the storage 92 while associating the library number corresponding to the component attributes of the component P of the image data Dp with the image data Dp. As just described, the image data Dp is stored in association with the component attributes of the component P via this library number.

Figure 7:
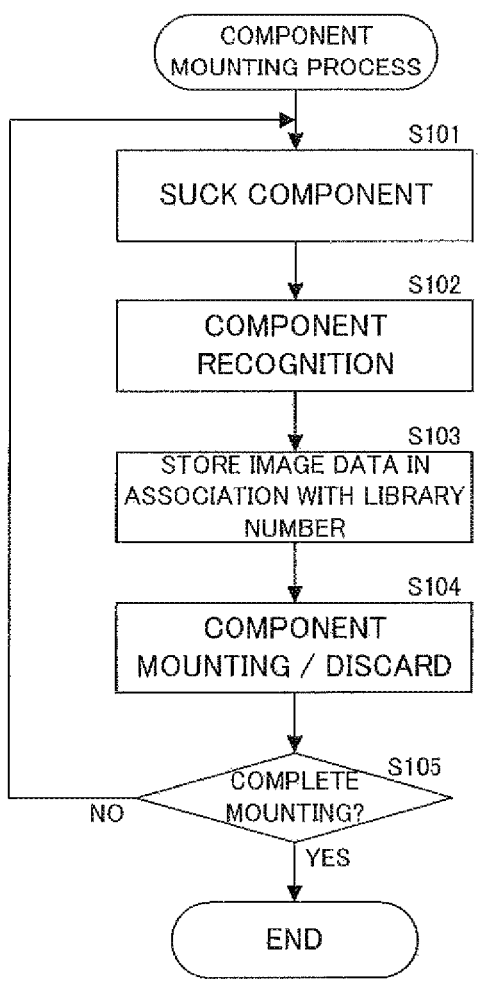
FIG. 7 is a flow chart showing an example of the component mounting process.

Next, the operation of the server computer 9 is described through an operation in the component mounting process using FIG. 7. FIG. 7 is a flow chart showing an example of the component mounting process. In Step S101, the mounting head 4 sucks the component P from the component supply position 32 using the nozzle 41 in the component mounter 10. If the mounting head 4 moves toward the imaging range F and the component P reaches the imaging range F, the imaging control unit 140 performs the component recognition in the aforementioned procedure using the component recognition camera 5 (Step S102).

The component mounter 10 transmits the image data Dp of the component P obtained in the component recognition to the server computer 9 together with the component attributes of the component P. Then, the server computer 9 stores the library number corresponding to the component attributes of the component P included in the image data Dp in the storage 92 in association with the image data Dp (Step S103) upon receiving the image data Dp and the component attributes of the component P.

In Step S104, the component mounting system 1 mounts the component P on the board B or discards the component P according to a result of the component recognition (Step S104). Then, Steps S101 to S104 are repeated until the mounting of the component P in the component mounter 10 is completed (until "YES" is judged in Step S105). In this way, the image data Dp of the component P obtained in the component recognition is accumulated in the storage 92 of the server computer 9 in parallel with the execution of the component mounting process, and the image database of FIG. 6 is generated.

Then, the server computer 9 optimizes the recognition parameters used in the component recognition in the component mounter 10 based on the image data Dp of the component P accumulated in the storage 92. Next, this point is described.

Figure 8:
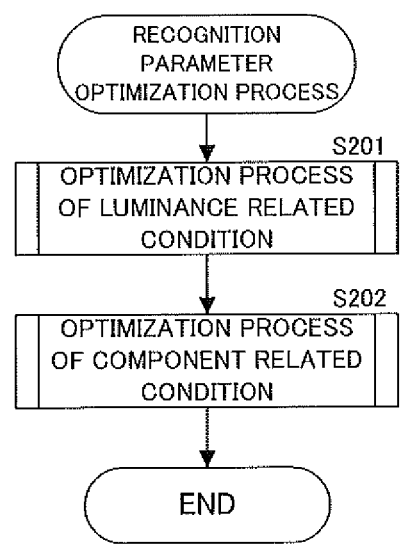
FIG. 8 is a flow chart showing an example of a recognition parameter optimization process.
Figure 9:
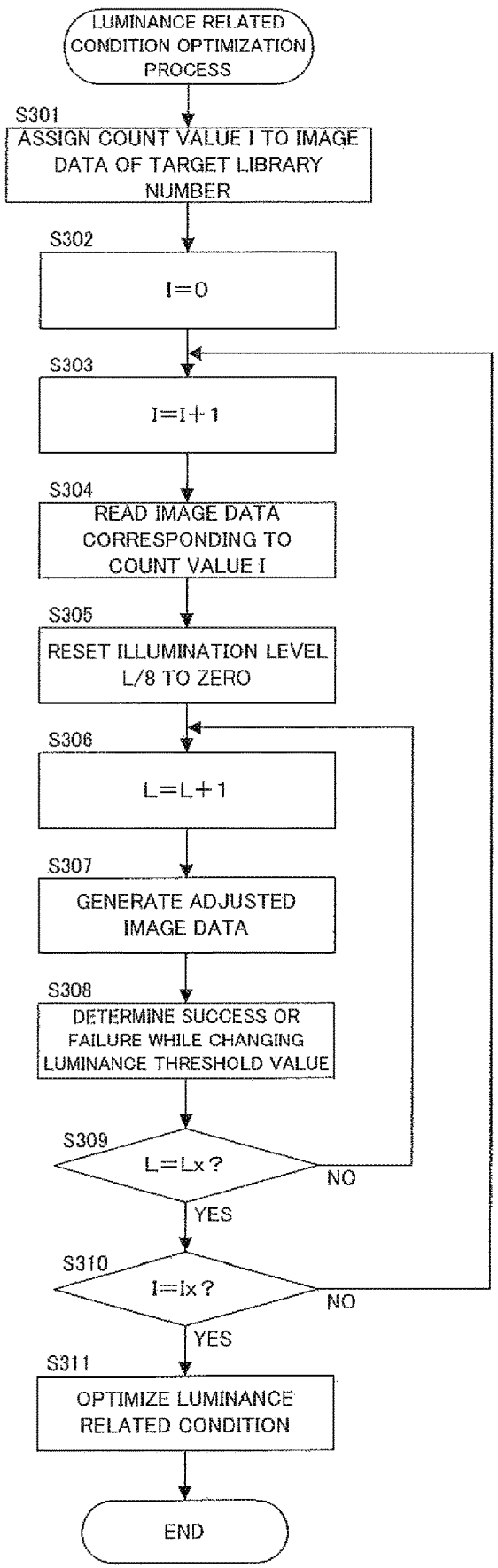
FIG. 9 is a flow chart showing an example of an optimization process of the luminance related condition, out of the recognition parameters.
Figure 11:
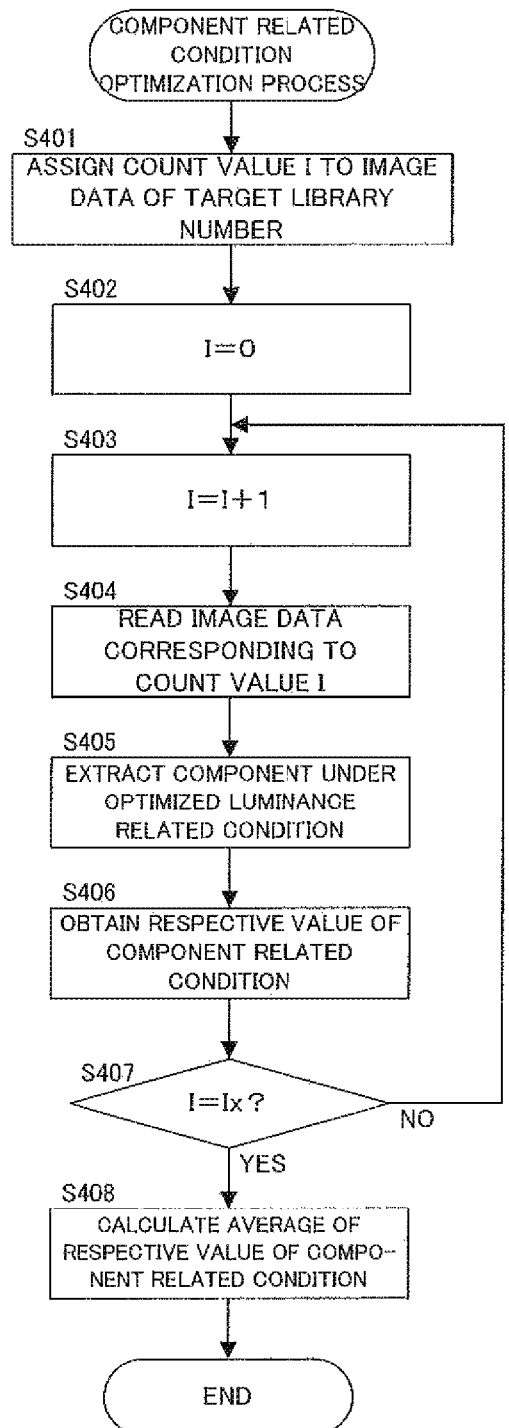
FIG. 11 is a flow chart showing an example of an optimization process of the component related condition, out of the recognition parameters.

FIG. 8 is a flow chart showing an example of a recognition parameter optimization process, FIG. 9 is a flow chart showing an example of an optimization process of the luminance related condition, out of the recognition parameters, FIG. 10 is a table showing a calculation result in the optimization process of the luminance related condition of FIG. 9, and FIG. 11 is a flow chart showing an example of an optimization process of the component related condition, out of the recognition parameters. The flow charts shown in FIGS. 8, 10 and 11 are performed by the arithmetic unit 91 of the server computer 9, for example, using one component attribute (in other words, library number) designated by an operator as a target.

In the recognition parameter optimization process of FIG. 8, the optimization process of the component related condition (Step S202) is performed after the optimization process of the luminance related condition (Step S201), out of the recognition parameters, is performed. Here, the luminance related condition is a parameter relating to the luminance of the image data Dp, i.e. a combination of the illumination level and the luminance threshold value, and the component related condition is a combination of the shape of the component P, the size of the component P, the electrode positions of the component P and the electrode sizes of the component P.

As shown in FIG. 9, in the luminance related condition optimization process (Step S201), count values I (=1, 2, 3, ...) are assigned to the respective pieces of the image data Dp corresponding to the target library number of the optimization process (Step S301). Taking the image database of FIG. 6 as an example, the count value I is assigned to the image data Dp(1), Dp(3), Dp(6), Dp(9), ... in a chronological order of storage dates, for example, if the target library number as a target of the optimization process is "2". Then, the count value I is reset to zero (Step S302) and incremented (Step S303).

Subsequently, upon reading the image data Dp corresponding to the count value I from the storage 92 (Step S304), the arithmetic unit 91 resets a numerator L of an illumination level L/8 to zero (Step S305) and increments the numerator L of the illumination level. Then, the arithmetic unit 91 generates adjusted image data Dpa equivalent to a case where an image in the image data Dp of the count value I is captured at the illumination level L/8 by adjusting the luminance of the image data Dp of the count value I by an image processing (Step S307). Then, the arithmetic unit 91 determines whether or not the component recognition by each luminance threshold value has succeeded while changing the luminance threshold value (Step S308).

In this way, a result of a row of the illumination level 1/8 of FIG. 10 is obtained. In FIG. 10, a success (OK) and a failure (NG) of the component recognition in the case of changing the luminance threshold value expressed in 256 gradation levels by 10 gradation levels are shown. At the illumination level 1/8, the component recognition succeeded only when the luminance level was 50 and the component recognition failed when the luminance threshold value was 10 to 40 or 60 to 250.

By repeating Steps S306 to S308 until the numerator L of the illumination level L/8 reaches a maximum value Lx (=8), whether or not the component recognition has succeeded is determined for each threshold value at each illumination level L/8 while the illumination level L/8 is changed (increased). In this way, a result of the entire table shown in FIG. 10 (success/failure map) is obtained.

If the numerator L of the illumination level L/8 reaches the maximum value Lx, it is judged whether or not the count value I has reached a maximum value Ix, i.e. the number of pieces of the image data Dp of the target library number, in Step S301 (Step S310). By repeating Steps S303 to S309 until the count value I reaches the maximum value Ix, the success/failure map of FIG. 10 is obtained for each of Ix pieces of the image data Dp.

If the count value I reaches the maximum value Ix ("YES" in Step S310), the luminance related condition is optimized based on the success/failure map of each piece of the image data Dp (Step S311). That is, the success/failure map of FIG. 10 shows whether or not the component recognition will succeed by each combination of the illumination level and the luminance threshold value (i.e. each luminance related condition). Accordingly, the arithmetic unit 91 generates a histogram having the combination of the illumination level and the luminance threshold as a class and the number of the successes in the component recognition by this combination as a frequency, and calculates the combination located at a center of gravity of this histogram as an optimal combination, i.e. an optimal luminance related condition.

As shown in FIG. 8, if the luminance related condition is optimized (Step S201), the component related condition is optimized (Step S202). As shown in FIG. 11, in the optimization process of the component related condition, Steps S401 to S403 are respectively performed similarly to Steps S301 to S303 described above, and the count value I of each piece of the image data Dp corresponding to the library number as a target of the optimization process is reset to zero and further incremented.

Subsequently, the arithmetic unit 91 extracts the component P from the image data Dp by the luminance related condition optimized in Step S201 upon reading the image data Dp corresponding to the count value I from the storage 92 (Step S404). Specifically, by adjusting the luminance of the image data Dp of the count value I by an image processing, adjusted image data Dpb equivalent to a case where an image included in the image data Dp of the count value I is captured at the illumination level of the optimized luminance related condition is generated. Then, the arithmetic unit 91 extracts an image of an edge of the component P from the adjusted image data Dpb using the luminance threshold value of the optimized luminance related condition.

In Step S406, the respective values (shape of the component P, size of the component P, electrode positions of the component P and electrode sizes of the component P) of the component related condition are obtained for the component P extracted in Step S405, and it is judged in Step S407 whether or not the count value I has reached the maximum value Ix (Step S407). By repeating Steps S403 to S406 until the count value I reaches the maximum value Ix, the respective values of the component related condition are obtained for each of the Ix pieces of the image data Dp. When the count value I reaches the maximum value Ix ("YES" in Step S408), average values of the respective values of the component related condition obtained from each piece of the image data Dp are calculated (Step S408).

In this way, the flow chart of FIG. 8 is completed and the recognition parameters (luminance related condition and component related condition) are optimized. As a result, in the component data library (FIG. 5), the recognition parameters of the target library number are updated to the optimized recognition parameters. Next, a mode of utilizing the thus optimized recognition parameters at the time of production start preparation of component-mounted boards is described.

Figure 12:
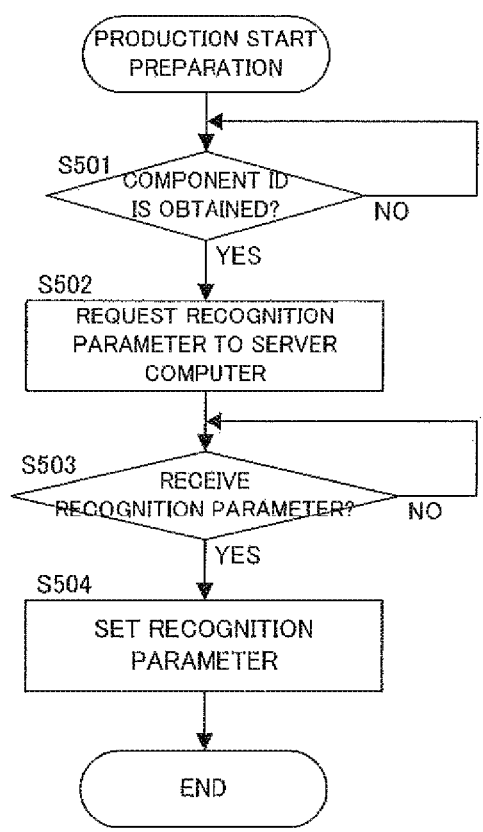
FIG. 12 is a flow chart showing a first example of the production start preparation performed in the component mounter.
Figure 13:
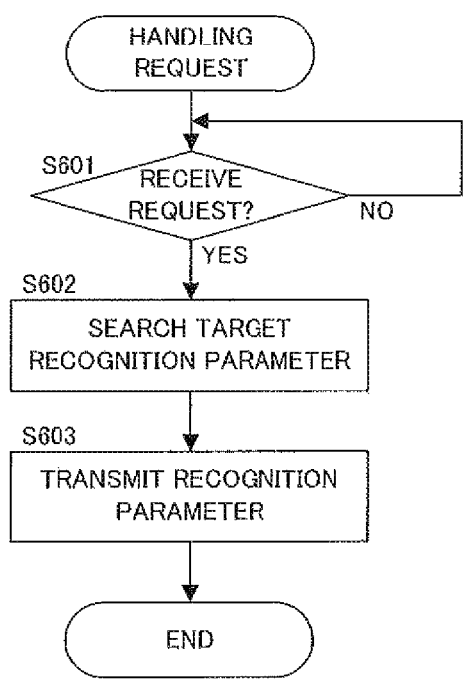
FIG. 13 is a flow chart showing an example of the operation of the server computer for handling a request from the component mounter based on the production start preparation of FIG. 12.

FIG. 12 is a flow chart showing a first example of the production start preparation performed in the component mounter, and FIG. 13 is a flow chart showing an example of the operation of the server computer for handling a request from the component mounter based on the production start preparation of FIG. 12. The flow chart of FIG. 12 is performed by the arithmetic unit 110 of the component mounter 10 and the flow chart of FIG. 13 is performed by the arithmetic unit 91 of the server computer 9.

In the production start preparation, an operator reads the component ID 73 of the component supply reel 7 by the ID reader 8 in loading the component supply reel 7 into the tape feeder 31. Accordingly, in Step S501 of the production start preparation (FIG. 12), the arithmetic unit 110 of the component mounter 10 confirms whether or not the component ID 73 has been obtained by the ID reader 8 (Step S501). If the component ID 73 is obtained ("YES" in Step S501), the arithmetic unit 110 requests the recognition parameters corresponding to the component attributes to the server computer 9 by transmitting the component attributes indicated by the component ID 73 to the server computer 9 via the communication unit 150 (Step S502).

On the other hand, as shown in FIG. 13, upon receiving the request for the recognition parameters ("YES" in Step S601), the arithmetic unit 91 of the server computer 9 searches the recognition parameters associated with the component attributes indicated by this request from the component data library (FIG. 5) (Step S602). Then, the arithmetic unit 91 transmits the searched recognition parameter to the component mounter 10 by the communication unit 93 (Step S603).

Then, as shown in FIG. 12, upon receiving the recognition parameters from the server computer 9 ("YES" in Step S503), the arithmetic unit 110 of the component mounter 10 sets the recognition parameter for the imaging control unit 140 (Step S504). Therefore, the component recognition is performed based on the recognition parameter in the component mounting process after the production start.

In the embodiment described above, the image data Dp obtained by imaging the component P in the component recognition (Step S102) when the component mounter 10 mounts the component P on the board B is stored in the storage 92 (Step S103), and the luminance related condition is optimized based on this image data Dp (Steps S201, S301 to S311). Therefore, a proper luminance related condition corresponding to the component P to be actually mounted can be obtained.

Further, the storage 92 stores the image data Dp in association with the attributes of the image data Dp (specifically, the component attributes of the component P of the image data Dp) (Step S103). Then, the arithmetic unit 91 optimizes the luminance related condition, by which the component recognition for the component P of the type corresponding to the same attribute (in other words, library number) is performed, based on a plurality of pieces of the image data Dp having the same attribute (Steps S201, S301 to S311). In such a configuration, a proper luminance related condition corresponding to the type of the component P to be actually mounted can be obtained.

Further, if the attributes of the image data Dp planned to be obtained in the component recognition after the production start are received by the communication unit 93 (Step S601), the arithmetic unit 91 transmits the luminance related condition optimized based on the image data Dp having the attributes received by the communication unit 93 to the component mounter 10 via the communication unit 93 (Step S603). Therefore, the component recognition after the production start preparation can be properly performed on the luminance related condition corresponding to the attributes of the image data Dp of the component P planned to be obtained in the component recognition.

Further, in the component recognition, the component P is recognized based on a comparison of the component P extracted from the image data Dp using the threshold value of the luminance related condition and the component related condition on the configuration of the component P (Step S102). In contrast, the arithmetic unit 91 optimizes the component related condition based on the configuration of the component P extracted from the image data Dp using the threshold value of the optimized luminance related condition and stores the optimized component related condition in the storage 92 (Steps S202, S401 to S408). Therefore, the component related condition corresponding to the optimized luminance related condition can be obtained.

Figure 14:
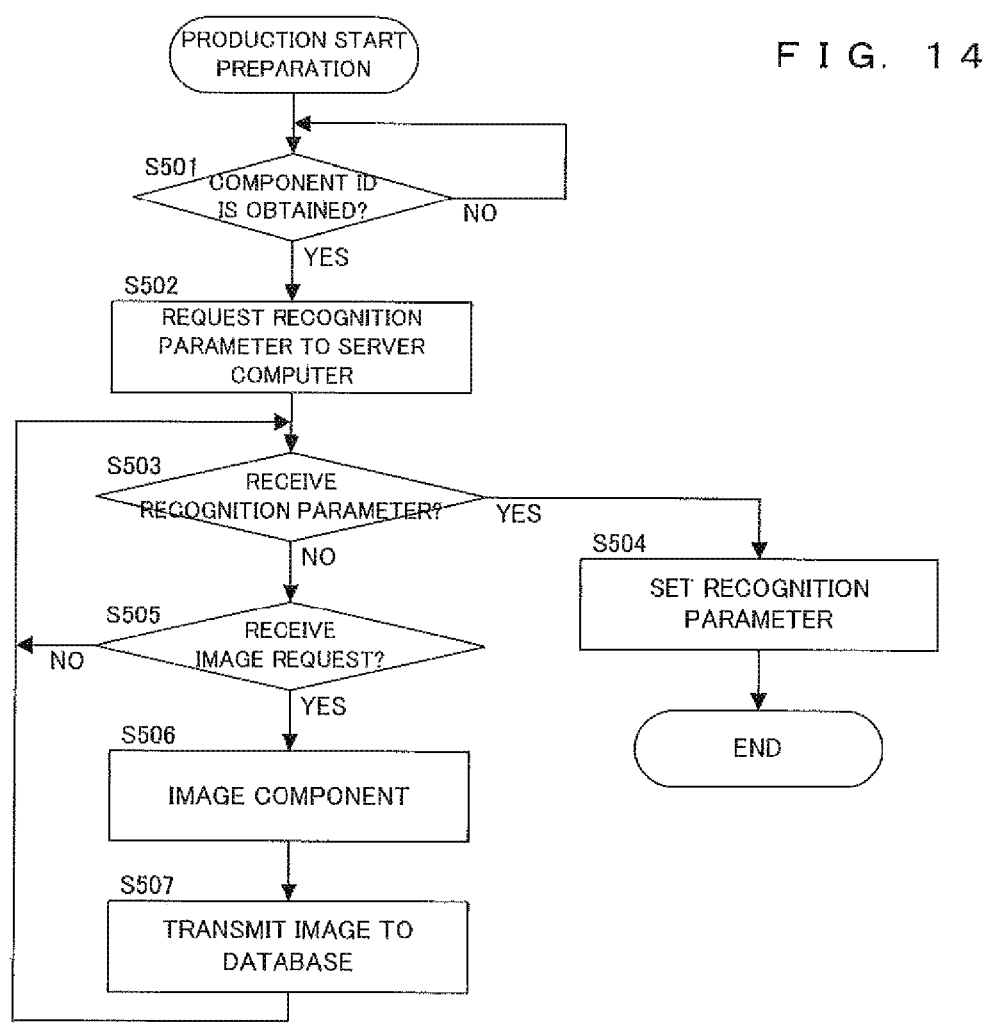
FIG. 14 is a flow chart showing a second example of the production start preparation performed in the component mounter.
Figure 15:
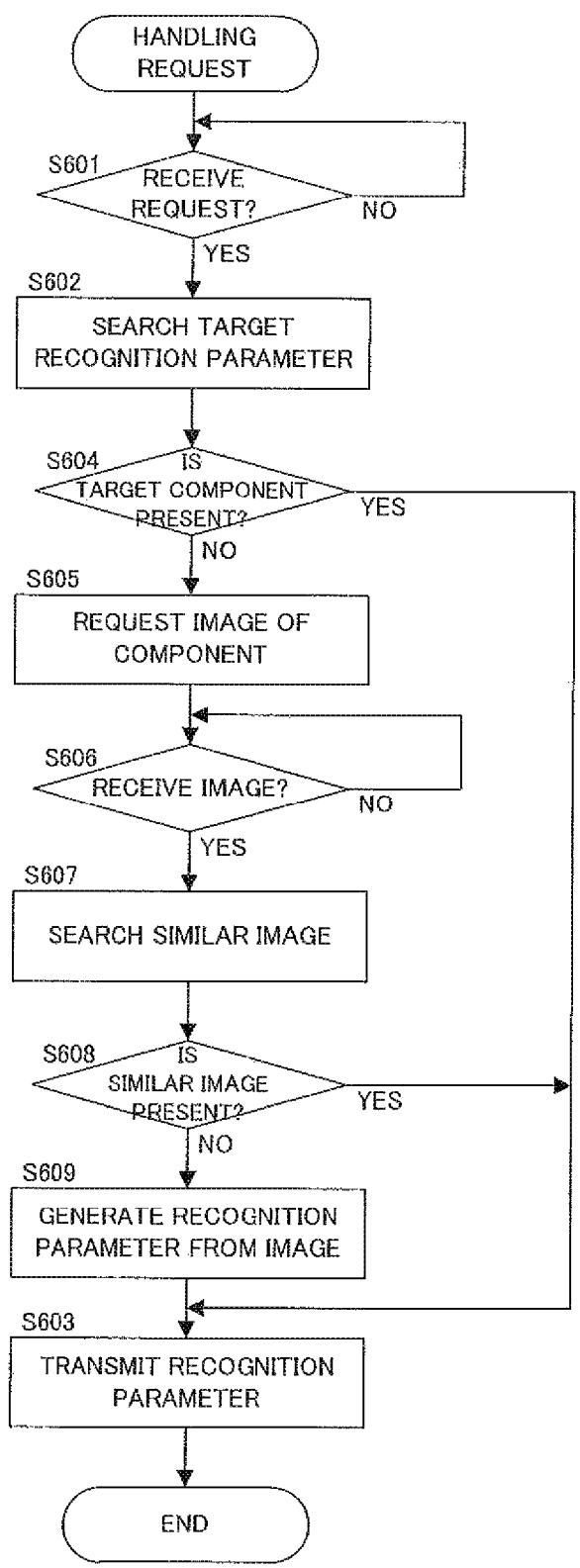
FIG. 15 is a flow chart showing an example of the operation of the server computer for handling a request from the component mounter based on the production start preparation of FIG. 14.

FIG. 14 is a flow chart showing a second example of the production start preparation performed in the component mounter, and FIG. 15 is a flow chart showing an example of the operation of the server computer for handling a request from the component mounter based on the production start preparation of FIG. 14. The flow chart of FIG. 14 is performed by the arithmetic unit 110 of the component mounter 10 and the flow chart of FIG. 15 is performed by the arithmetic unit 91 of the server computer 9. Note that the following description is centered on points of difference from the above first example, and common points are denoted by corresponding reference signs and the description thereof is omitted as appropriate. However, it goes without saying that similar effects are achieved by having a configuration common to the first example.

Also in the second example shown in FIG. 14, the component mounter 10 performs Steps S501 and S502 to request the recognition parameters corresponding to the component attributes obtained by the ID reader 8 to the server computer 9 as in the above first example. Then, as shown in FIG. 15, upon receiving the request for the recognition parameters ("YES" in Step S601), the arithmetic unit 91 of the server computer 9 searches the recognition parameters associated with the component attributes indicated by this request from the component data library (FIG. 5) (Step S602).

In Step S604, the arithmetic unit 91 judges whether or not the corresponding recognition parameter is present in the component data library. If the corresponding recognition parameter is present ("YES" in Step S604), the arithmetic unit 91 transmits the recognition parameter to the component mounter 10 by the communication unit 93 (Step S603). On the other hand, if the corresponding recognition parameter is absent ("NO" in Step S604), the arithmetic unit 91 requests the image data Dp of the component P having the component attributes relating to the request in Step S601 to the component mounter 10 via the communication unit 93 (Step S605).

As shown in FIG. 14, in the component mounter 10, the arithmetic unit 110 judges whether or not the recognition parameters corresponding to the request have been received from the server computer 9 (Step S503) after the request in Step S502. As described above, if "YES" is judged in Step S604 in handling request, the recognition parameter is transmitted from the server computer 9 to the component mounter 10 (Step S603). Thus, it is judged in Step S503 that the recognition parameters have been received, and the recognition parameters are set (Step S504).

On the other hand, if the reception of the recognition parameters cannot be confirmed in Step S503 ("NO"), the arithmetic unit 110 judges whether or not a request for the image data Dp has been received from the server computer 9 (Step S505). If the reception of the image request cannot be confirmed ("NO" in Step S505), return is made to Step S503. On the other hand, if the image data Dp has been requested in Step S605 in handling request as described above, "YES" is judged in Step S505 and advance is made to Step S506. In Step S506, the arithmetic unit 110 obtains the image data Dp by imaging the component P having the component attributes of the component ID 73 obtained in Step S501. Then, the arithmetic unit 110 transmits this image data Dp to the server computer 9.

In contrast, as shown in FIG. 15, the arithmetic unit 91 judges whether or not the image data Dp has been received from the component mounter 10 in the server computer 9 (Step S606). If the image data Dp is received ("YES" in Step S606), the image data Dp similar to the received image data Dp is searched from the image database (Step S607). If the similar image data Dp is present ("YES" in Step S608), the arithmetic unit 91 transmits the recognition parameters associated with this image data Dp via the library number to the component mounter 10 (Step S603). In the component mounter 10, upon receiving the recognition parameters, the reception of the recognition parameters is confirmed in Step S503 (YES) and the recognition parameters are set in Step S504.

On the other hand, if the similar image data Dp is absent ("NO" in Step S608), the recognition parameters are generated from the image data Dp received in Step S606 (Step S609). Out of the recognition parameters, the component related condition is obtained, for example, by being extracted by an existing image processing technique such as the binarization of the image data Dp. Further, the luminance related condition is obtained as follows. Specifically, Steps S305 to S309 of FIG. 9 are performed for the image data Dp to generate a success/failure map for the image data Dp, and the luminance related condition located at a center of gravity of this success/failure map is obtained. Further, the flow chart of FIG. 11 is performed based on this luminance related condition to obtain the component related condition. The component related condition and the luminance related condition obtained in this way are transmitted as the recognition parameters to the component mounter 10 (Step S603) and set in the component mounter 10 (Step S504).

In the embodiment described above, the component mounter 10 obtains the image data Dp by imaging the component P before the start of the component recognition (Step S506) and transmits this to the server computer 9 (Step S507), whereby the luminance related condition optimized based on the image data Dp having a predetermined relationship with the transmitted image data Dp can be received. Therefore, the component mounter 10 can start the component recognition in component mounting on the luminance related condition corresponding to the component P to be actually mounted.

Particularly, the arithmetic unit 91 transmits the luminance related condition optimized based on the image data Dp similar to the image data Dp received by the communication unit 93 to the component mounter 10 via the communication unit 93. Therefore, the component mounter 10 can properly start the component recognition based on the luminance related condition optimized based on the image data Dp similar to the image data Dp of the component P obtained before the start of the component recognition.

Figure 16:
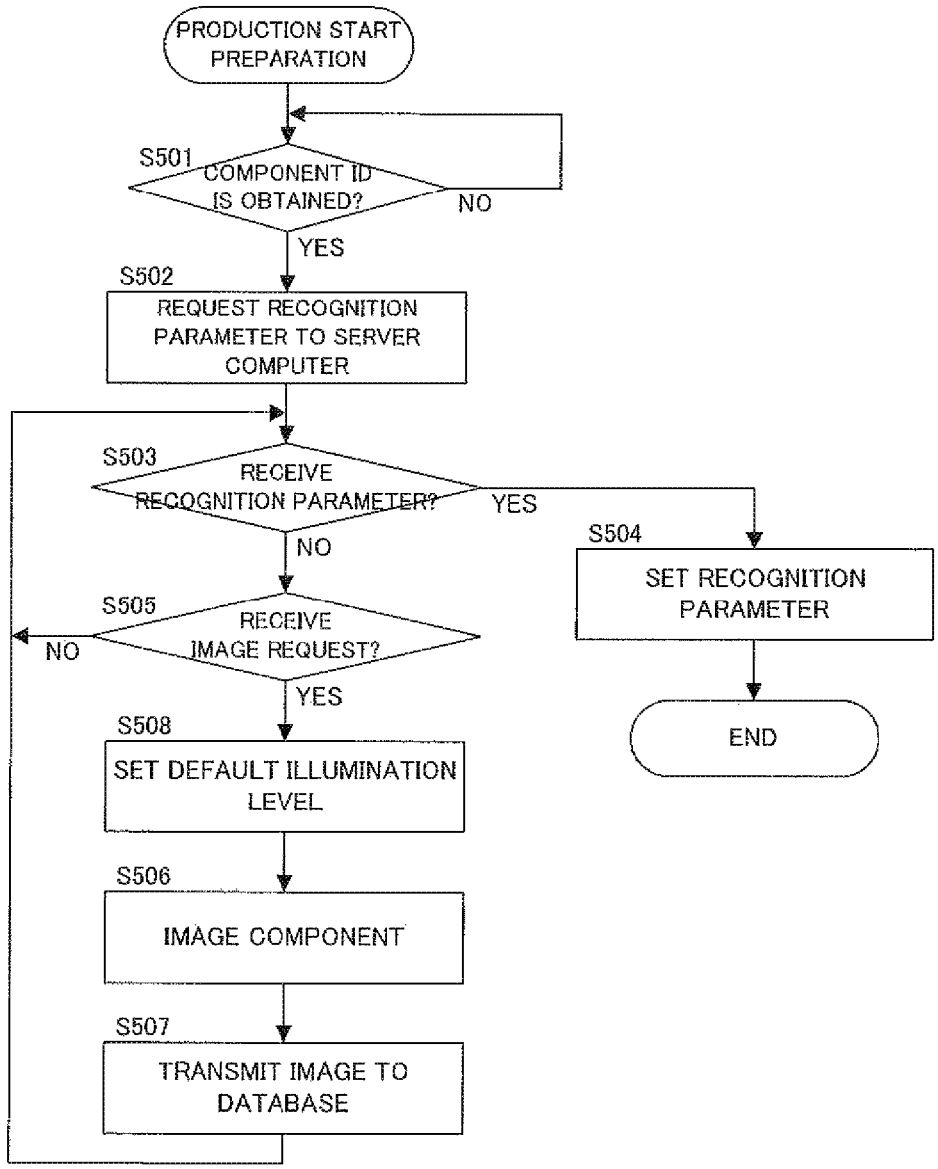
FIG. 16 is a flow chart showing a third example of the production start preparation performed in the component mounter.

FIG. 16 is a flow chart showing a third example of the production start preparation performed in the component mounter, and FIG. 17 is a table showing an example of the image database, upon which the production start preparation of FIG. 16 is premised. Since a flow chart for handling a request from the component mounter based on the production start preparation of FIG. 16 is similar to that of FIG. 15, the flow chart of FIG. 15 is used. Note that the following description is centered on points of difference from the above first and second examples, and common points are denoted by corresponding reference signs and the description thereof is omitted as appropriate. However, it goes without saying that similar effects are achieved by having a configuration common to the first and second examples.

The image database of FIG. 17 is generated by performing Step S103 of the flow chart of FIG. 7 described above. However, the arithmetic unit 91 stores the image data Dp in the storage 92 together with reference image data Dpr generated based on the image data Dp. Specifically, the arithmetic unit 91 generates the reference image data Dpr equivalent to a case where an image included in the image data Dp is captured at a predetermined default illumination level (e.g. 4/8) by adjusting the luminance of the image data Dp by an image processing. Then, the arithmetic unit 91 generates the image database of FIG. 17 by assigning the library numbers and storing the image data Dp and the reference image data Dp in the storage 92.

The flow chart of the production start preparation of FIG. 16 is performed on the premise of this image database. Also in the third example shown in FIG. 16, the component mounter 10 performs Steps S501 to S505 as in the above second example. Then, the component mounter 10 images the component P (Step S506) and transmits the image data Dp to the server computer 9 (Step S507) upon receiving a request for the image data Dp from the server computer 9. However, in the third example, the illumination level of the light irradiation unit 51 is set to the default illumination level before Step S506 (Step S508). The component P is imaged while light of the default illumination level is irradiated to the component P in Step S506.

Thus, in handling request of FIG. 15, the server computer 9 receives the image data Dp captured at the default illumination level (Step S606). Accordingly, the server computer 9 searches the reference image data Dpr similar to this image data Dp from the image database (Step S607). If the corresponding reference image data Dpr is present ("YES" in Step S608), the storage 92 transmits the recognition parameters associated with this image data Dpr via the library number to the component mounter 10 (Step S603).

In the embodiment described above, the component mounter 10 obtains the image data Dp by imaging the component P on the default illumination condition of irradiating light of the default illumination level from the light irradiation unit 51, and transmits the obtained image data Dp to the server computer 9. On the other hand, in the server computer 9, the storage 92 stores the reference image data Dpr, equivalent to a case where the image data Dp obtained using predetermined recognition parameters in the component recognition is captured on the default illumination condition, in association with the recognition parameters via the library number. Then, the arithmetic unit 91 transmits the recognition parameters associated with the reference image data Dpr similar to the received image data Dp to the component mounter 10. In such a configuration, the server computer 9 can precisely transmit suitable recognition parameters to the component mounter 10 based on the image data Dp obtained by the component mounter 10 imaging the component P on the default illumination condition.

Figure 18:
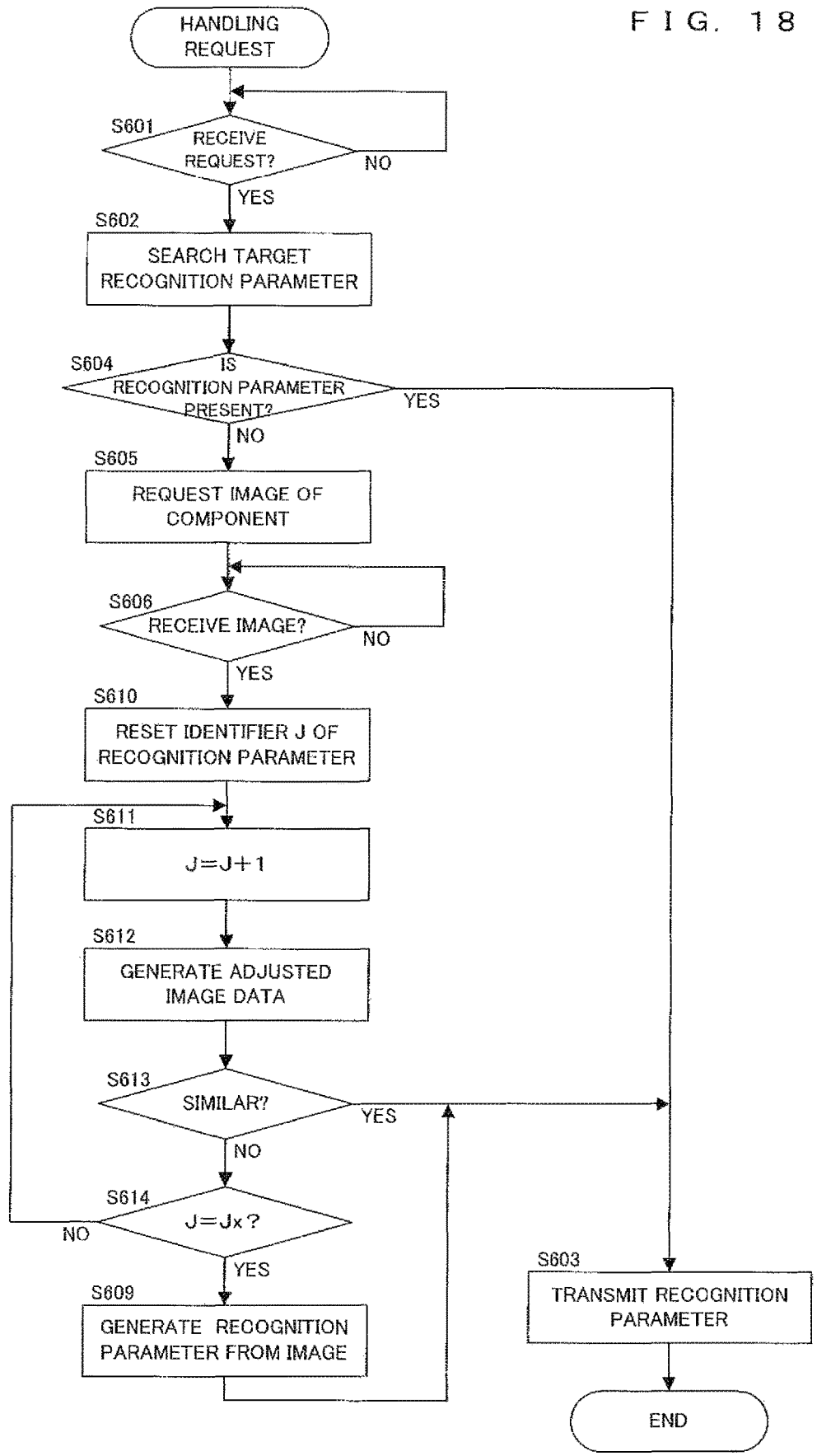
FIG. 18 is a flow chart showing a modification of handling request corresponding to the third example of the production start preparation.

FIG. 18 is a flow chart showing a modification of handling request corresponding to the third example of the production start preparation. The following description is centered on points of difference from the above first to third examples, and common points are denoted by corresponding reference signs and the description thereof is omitted as appropriate. However, it goes without saying that similar effects are achieved by having a configuration common to the first to third examples.

In this modification, as in the above third example, the component mounter 10 transmits image data Dp obtained by imaging the component P on the default illumination condition according to a request for the image data Dp from the server computer 9. However, unlike the above third example, the storage 92 of the server computer 9 includes no reference image data Dpr. Accordingly, the server computer 9 performs Steps S610 to S614 of FIG. 18 instead of Steps S607 to S608 of FIG. 15 in processing request.

Specifically, in Step S610, a library number J as an identifier for identifying each recognition parameter in the component data library of FIG. 5 is reset to zero in Step S610, and the library number J is incremented in Step S611. In Step S612, the arithmetic unit 91 generates adjusted image data Dpc equivalent to a case where an image included in the image data Dp captured on the default illumination condition is captured at the illumination level indicated by the recognition parameters of the library number J. Specifically, the adjusted image data Dpc is generated by adjusting the luminance of the image data Dp received in Step S606 according to a difference between the default illumination level and the illumination level of the recognition parameter.

In Step S614, the arithmetic unit 91 judges whether or not the adjusted image data Dpc and the image data Dp associated with the recognition parameters of the library number J are similar. Note that if there are a plurality of pieces of the image data Dp associated with the recognition parameters of the library number J, the image data Dp having, for example, a latest date of storage can be used for similarity judgment. If the adjusted image data Dpc and the image data Dp are similar ("YES" in Step S614), the arithmetic unit 91 transmits the component recognition parameters assigned with the library number J to the component mounter 10 (Step S603).

On the other hand, if the adjusted image data Dpc and the image data Dp are not similar ("NO" in Step S613), the arithmetic unit 91 judges whether or not the library number J has reached a maximum value Jx (Step S614). If the library number J is smaller than the maximum value Jx ("NO" in Step S614), Steps S611 to S613 are repeated. On the other hand, if the library number J has reached the maximum value Jx ("YES" in Step S614), the recognition parameters are generated from the image data Dp received in Step S606 (Step S609).

In the embodiment described above, the storage 92 stores the image data Dp used for the optimization of the luminance related condition and the luminance related condition in association by the library number (Steps S103, S201, S301 to S311). Further, the arithmetic unit 91 transmits the luminance related condition associated with the image data Dp satisfying a predetermined collation condition (Steps S612, S613) as a result of collating the received image data Dp and the image data Dp associated with the luminance related condition (Steps S610 to S614) to the component mounter 10 (Step S603). Here, the collation condition is a condition on which the adjusted image data Dpc obtained by adjusting the luminance of the image data Dp obtained on the default illumination condition according to a difference between the default illumination condition and the luminance related condition associated with the image data Dp to be collated and the image data Dp to be collated are similar (Steps S612, S613). In such a configuration, the server computer 9 can precisely transmit a proper luminance related condition to the component mounter based on the image data Dp obtained by the component mounter 10 imaging the component P on the default illumination condition.

As just described, in this embodiment, the component mounting system 1 corresponds to an example of a "component mounting system" of the disclosure, the component mounter 10 corresponds to an example of a "component mounter" of the disclosure, the light irradiation unit 51 corresponds to an example of an "illuminator" of the disclosure, the imaging unit 55 corresponds to an example of a "camera" of the disclosure, the component P corresponds to an example of a "component" of the disclosure, the board B corresponds to an example of a "board" of the disclosure, Step S102 corresponds to an example of "component recognition" of the disclosure, the luminance related condition included in the recognition parameters corresponds to an example of a "luminance related condition" of the disclosure, the luminance threshold value corresponds to an example of a "threshold value" of the disclosure, the server computer 9 corresponds to an example of a "recognition parameter optimization device" of the disclosure, the arithmetic unit 91 corresponds to an example of an "arithmetic unit" of the disclosure, the storage 92 corresponds to an example of a "storage" of the disclosure, the communication unit 93 corresponds to an example of a "communication unit" of the disclosure, the image data Dp corresponds to an example of "image data" of the disclosure, the component attribute corresponds to an example of an "attribute" of the disclosure, the reference image data Dpr corresponds to an example of "reference image data" of the disclosure, the adjusted image data Dpc corresponds to an example of "adjusted image data" of the disclosure, and the default illumination condition corresponds to an example of a "predetermined illumination condition" of the disclosure.

Note that the disclosure is not limited to the above embodiment and various changes can be made to the above embodiment without departing from the gist of the disclosure. For example, a case where the component attributes are included as the attributes of the image data Dp has been illustrated in the above embodiment. However, the attributes of the image data Dp can include elements other than the component attributes. Specifically, the attributes of the image data Dp may be distinguished by a combination of the type of the component P and at least one of the manufacturer of the component P as a target of the component recognition, the imaging unit 55 used in the component recognition, and the component mounting system 1 having performed the component recognition. In such a configuration, a proper luminance related condition corresponding to the manufacturer of the component P as a target of the component recognition, the imaging unit 55 used in the component recognition or the component mounting system 1 having performed the component recognition, and the like can be obtained.

Further, if the corresponding recognition parameters are not found in handling request, an error may be notified to the operator instead of generating the recognition parameters in Step S609.

Further, a method for extracting the component P from the image data Dp is not limited to the above example. For example, the component P may be extracted by a background subtraction method based on the image data Dp and a background image. In this case, a combination of the illumination level and a threshold value used in the background subtraction method serves as luminance related information.

Further, the optical sensor used in the component recognition camera 5 is not limited to the aforementioned area sensor and may be a line sensor.

Also, the configuration of the mounting head 4 may be of an in-line type in which the nozzles 41 are arranged in parallel to the X direction without limitation to a rotary type.

The invention claimed is:

1. A recognition parameter optimization device, comprising:
 a communication unit configured to receive image data obtained in a component mounter that performs component recognition to recognize a component based on a result of performing an image processing for a luminance indicated by the image data, which is obtained by imaging the component by a camera while irradiating light to the component from an illuminator, using a threshold value and mount the component on a board based on a result of the component recognition;
 a storage configured to store the image data received by the communication unit; and
 an arithmetic unit configured to optimize a luminance related condition indicating a combination of a brightness of the light of the illuminator and the threshold value used in the component recognition based on the image data stored in the storage and store an optimized luminance related condition in the storage,
 wherein
 the storage is configured to store the image data in association with an attribute of the image data,
 the attribute is distinguished by a combination of a type of the component included in the image data and at least one of a manufacturer of the component as a target of the component recognition and the component mounter having performed the component recognition, and
 the arithmetic unit is configured to optimize the luminance related condition in performing the component recognition for the type of the component corresponding to the same attribute based on a plurality of pieces of image data having the same attribute.

2. The recognition parameter optimization device according to claim 1, wherein, if the communication unit receives the attribute of the image data planned to be obtained in the component recognition, the arithmetic unit transmits the luminance related condition optimized based on the image data having the attribute received by the communication unit to the component mounter via the communication unit.

3. The recognition parameter optimization device according to claim 2, wherein, if the communication unit receives the image data obtained by the component mounter imaging the component before start of the component recognition, the arithmetic unit transmits the luminance related condition optimized based on the image data having a predetermined relationship with the image data received by the communication unit to the component mounter via the communication unit.

4. The recognition parameter optimization device according to claim 2, wherein:
the component is recognized in the component recognition based on a comparison of the component extracted from the image data using the threshold value of the luminance related condition and a component related condition on a configuration of the component, and
the arithmetic unit is configured to optimize the component related condition based on the configuration of the component extracted from the image data using the threshold value of the optimized luminance related condition and store an optimized component related condition in the storage.

5. A component mounting system, comprising:
a component mounter configured to perform component recognition to recognize a component based on a result of performing an image processing for a luminance indicated by the image data, which is obtained by imaging the component by a camera while irradiating light to the component from an illuminator, using a threshold value and mount the component on a board based on a result of the component recognition; and
the recognition parameter optimization device according to claim 2.

6. The recognition parameter optimization device according to claim 1, wherein, if the communication unit receives the image data obtained by the component mounter imaging the component before start of the component recognition, the arithmetic unit transmits the luminance related condition optimized based on the image data having a predetermined relationship with the image data received by the communication unit to the component mounter via the communication unit.

7. The recognition parameter optimization device according to claim 6, wherein the arithmetic unit is configured to transmit the luminance related condition optimized based on the image data similar to the image data received by the communication unit to the component mounter via the communication unit.

8. The recognition parameter optimization device according to claim 6, wherein the communication unit is configured to receive the image data obtained before the start of the component recognition by the component mounter imaging the component on a predetermined illumination condition of irradiating light of a predetermined brightness from the illuminator.

9. The recognition parameter optimization device according to claim 8, wherein:

the storage is configured to store the image data, equivalent to a case where the image data obtained on the luminance related condition is obtained on the predetermined illumination condition, as reference image data in association with the luminance related condition, and
the arithmetic unit is configured to transmit the luminance related condition associated with the reference image data similar to the image data received by the communication unit to the component mounter via the communication unit.

10. The recognition parameter optimization device according to claim 8, wherein:
the storage is configured to store the image data used in optimizing the luminance related condition and the luminance related condition in association,
the arithmetic unit is configured to transmit the luminance related condition associated with the image data satisfying a predetermined collation condition as a result of collating the image data received by the communication unit and the image data associated with the luminance related condition to the component mounter via the communication unit, and
the collation condition is a condition on which adjusted image data generated by adjusting a luminance of the image data received by the communication unit according to a difference between the predetermined illumination condition and the luminance related condition associated with the image data to be collated and the image data to be collated are similar.

11. The recognition parameter optimization device according to claim 6, wherein:
the component is recognized in the component recognition based on a comparison of the component extracted from the image data using the threshold value of the luminance related condition and a component related condition on a configuration of the component, and
the arithmetic unit is configured to optimize the component related condition based on the configuration of the component extracted from the image data using the threshold value of the optimized luminance related condition and store an optimized component related condition in the storage.

12. A component mounting system, comprising:
a component mounter configured to perform component recognition to recognize a component based on a result of performing an image processing for a luminance indicated by the image data, which is obtained by imaging the component by a camera while irradiating light to the component from an illuminator, using a threshold value and mount the component on a board based on a result of the component recognition; and
the recognition parameter optimization device according to claim 6.

13. The recognition parameter optimization device according to claim 1, wherein:
the component is recognized in the component recognition based on a comparison of the component extracted from the image data using the threshold value of the luminance related condition and a component related condition on a configuration of the component, and
the arithmetic unit is configured to optimize the component related condition based on the configuration of the component extracted from the image data using the threshold value of the optimized luminance related condition and store an optimized component related condition in the storage.

14. A component mounting system, comprising:
a component mounter configured to perform component recognition to recognize a component based on a result of performing an image processing for a luminance indicated by the image data, which is obtained by imaging the component by a camera while irradiating light to the component from an illuminator, using a threshold value and mount the component on a board based on a result of the component recognition; and
the recognition parameter optimization device according to claim 1.

15. A recognition parameter optimization method, comprising:
receiving image data by a communication unit, the image data being obtained by a component mounter that is configured to perform component recognition to recognize a component based on a result of performing an image processing for a luminance indicated by the image data, which is obtained by imaging the component by a camera while irradiating light to the component from an illuminator, using a threshold value and mount the component on a board based on a result of the component recognition;
storing the image data received by the communication unit in a storage; and
optimizing a luminance related condition indicating a combination of a brightness of the light of the illuminator and the threshold value used in the component recognition based on the image data stored in the storage, and storing an optimized luminance related condition in the storage,
wherein
the storage is configured to store the image data in association with an attribute of the image data,
the attribute is distinguished by a combination of a type of the component included in the image data and at least one of a manufacturer of the component as a target of the component recognition and the component mounter having performed the component recognition, and
the optimizing optimizes the luminance related condition in performing the component recognition for the type of the component corresponding to the same attribute based on a plurality of pieces of image data having the same attribute.

* * * * *